United States Patent [19]

Dentai et al.

[11] Patent Number: 5,432,123
[45] Date of Patent: Jul. 11, 1995

[54] METHOD FOR PREPARATION OF MONOLITHICALLY INTEGRATED DEVICES

[75] Inventors: Andrew G. Dentai, Atlantic Highlands, N.J.; Fumio Koyama, Sagamihara, Japan; Kang-Yi Liou, Holmdel, N.J.

[73] Assignee: AT&T Corp., Murray Hill, N.J.

[21] Appl. No.: 153,861

[22] Filed: Nov. 16, 1993

[51] Int. Cl.$^6$ ............................................. H01L 21/20
[52] U.S. Cl. ...................................... 437/129; 437/110
[58] Field of Search ...................... 437/129, 126, 110

[56] References Cited

U.S. PATENT DOCUMENTS

| | | | |
|---|---|---|---|
| 4,820,655 | 4/1989 | Noda et al. | 437/126 |
| 4,911,765 | 3/1990 | Song et al. | 437/129 |
| 4,922,500 | 5/1990 | Chang-Hasnain et al. | 437/129 |
| 5,358,896 | 10/1994 | Komatsu et al. | 437/129 |

OTHER PUBLICATIONS

C. J. Chang et al., "Integrated External Cavity Quantum Well Laser Array Using Single Epitaxial Growth on a Patterned Substrate" Applied Physics Letters, vol. 56 (5), Jan. 1990, pp. 429–431.

E. Kapon et al., "Molecular Beam Epitaxy of GaAs/AlGaAs Superlattice Heterostructures on Nonplanar Substrates" Applied Physics Letters, vol. 50 (6), Feb. 1987 pp. 347–349.

M. Suzuki et al., "Monolithic Integration of InGaAsP/InP Distributed Feedback Lasers and Electroabsorption Modulator by Vapor Phase Epitaxy" Journal of Lightwave Technology, vol. LT-5, No. 9, Sep. 1987, pp. 1277–1285.

*Primary Examiner*—R. Bruce Breneman
*Assistant Examiner*—Linda J. Fleck

[57] ABSTRACT

A monolithically integrated electroabsorption modulator/optical amplifier is described which is prepared using a lateral bandgap control technique with a planar III-V compund semiconductor substrate. The described device evidences a bandgap shift in excess of 60 nanometers, so indicating its applicability for integration of modulators and lasers or amplifiers. The device is fabricated by atmospheric pressure metal organic condensed vapor deposition growth of gallium indium arsenise/gallium indium aresenide phosphide strained quantum wells on ridges deposited on the substrate.

11 Claims, 3 Drawing Sheets

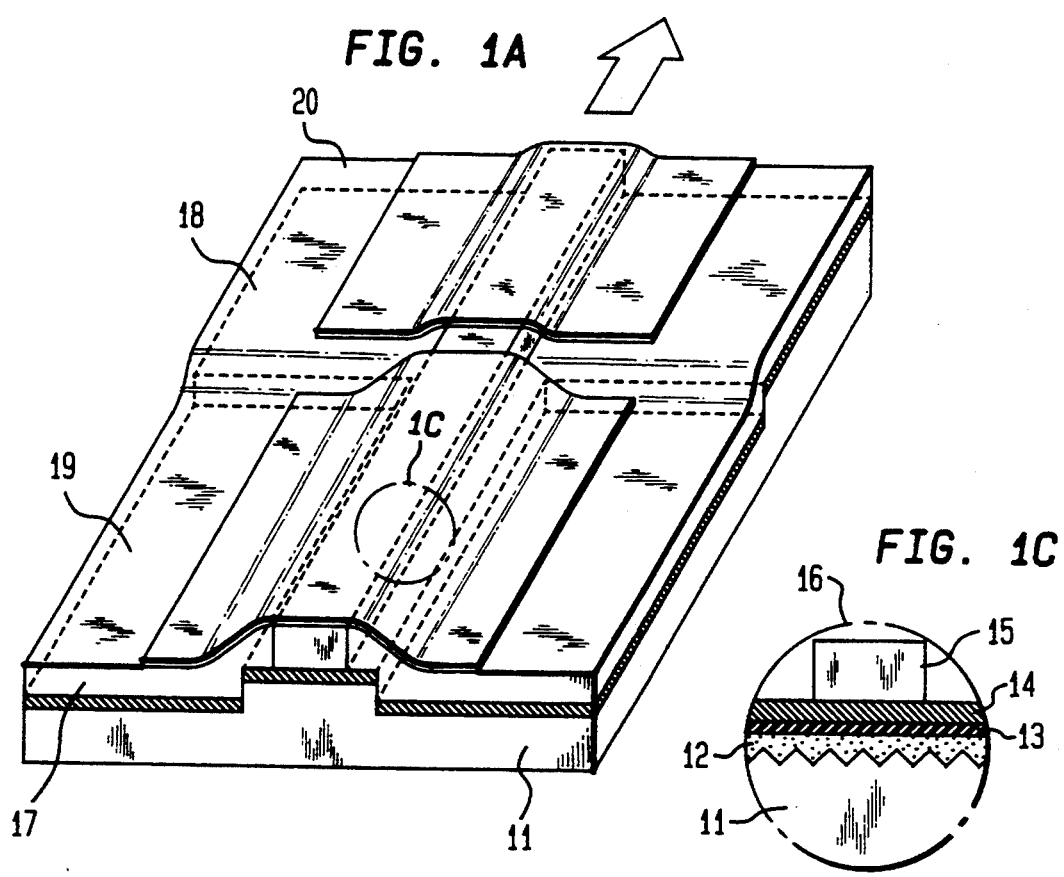
FIG. 1A
FIG. 1C
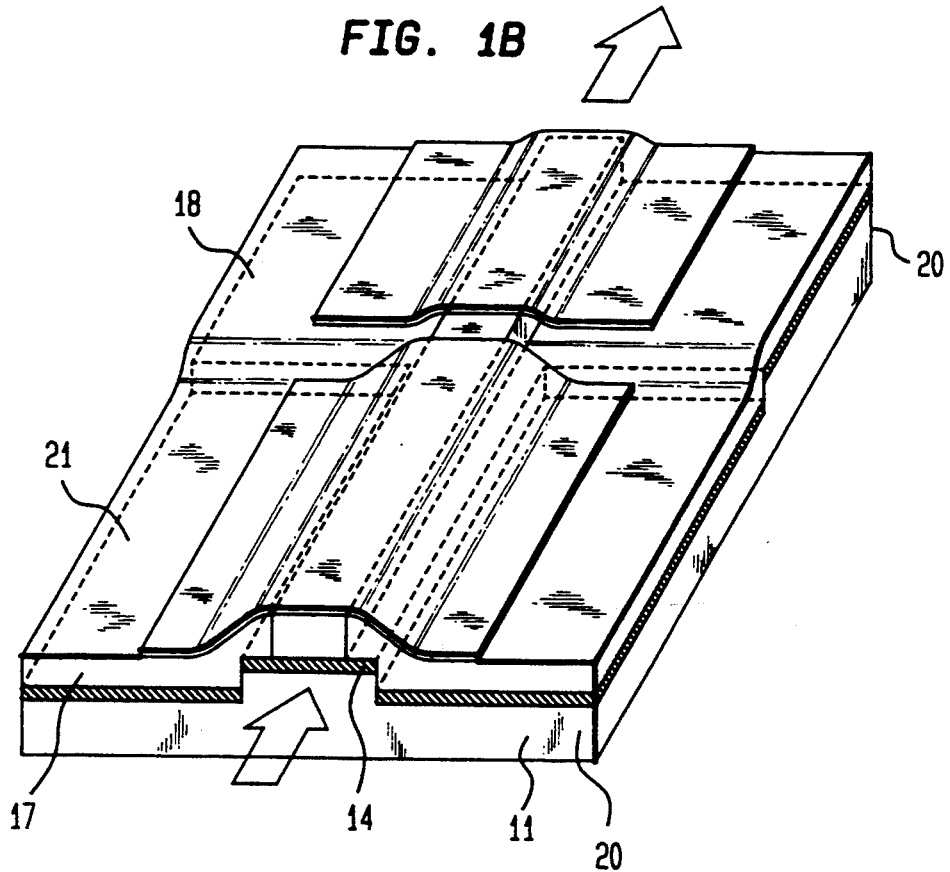
FIG. 1B

METHOD FOR PREPARATION OF MONOLITHICALLY INTEGRATED DEVICES

FIELD OF THE INVENTION

This invention relates to monolithically integrated devices and to a method for the preparation thereof. More particularly, the present invention relates to monolithically integrated DFB or DRB laser/electroabsorption modulator light sources prepared by the use of metal organic vapor phase epitaxy (MOVPE) on non-planar semiconductor substrates.

BACKGROUND OF THE INVENTION

During the past decade, there has been a birth of interest in a class of devices commonly referred to as monolithically integrated modulators with distributed feedback (DFB) lasers or distributed Bragg reflector (DBR) lasers. This spark of interest has been attributed to the fact that these structures evidence low wavelength chirp characteristics which are of particular interest for use in high speed lightwave communication systems.

Heretofore, in the fabrication of such devices, it has been the practice of workers in the art to integrate modulators with active elements such as lasers or amplifiers by the use of either butt joint couplings or selective area epitaxy. The butt joint coupling technique is limited in that epitaxial growth required for fabrication of the device of interest must be effected in more than one procedural steps. Unfortunately, this type of processing ofttimes results in the introduction of rough interfaces on the surface of the structure, particularly at those sites where it is desirable to effect joinder of the laser with the modulator. This typically leads to the deleterious scattering of light in the finished device.

Efforts to alleviate this difficulty focused upon the use of a technique commonly referred to as selective area epitaxy. In this process, a dielectric layer in the form of a thin film is deposited on the surface of the substrate prior to effecting growth of an epitaxial layer. This dielectric layer, which typically comprises silicon dioxide, also tends to introduce roughness upon the surface of the substrate and, more importantly, leads to the formation of a polycrystalline film grown on the surface of the dielectric which may interfere with further processing. Accordingly, workers in the art have continued their search for new techniques designed to eliminate the prior art deficiencies.

SUMMARY OF THE INVENTION

In accordance with the present invention, the prior art limitations encountered by those skilled in the art are effectively obviated by a novel processing sequence involving the use of a metal organic vapor phase epitaxy technique in conjunction with patterned substrates. Briefly, the inventive technique involves the monolithic integration of an electroabsorption modulator with an optical amplifier by the use of a lateral bandgap control procedure in combination with a non-planar substrate. The resultant devices have been found to evidence a bandgap wavelength shift of more than 60 nm, so suggesting their use for the integration of modulators and lasers or amplifiers. Structures of this type have been obtained by means of atmospheric pressure MOVPE growth of gallium indium arsenide/gallium indium arsenide phosphide strained quantum wells on ridges having a width of the order of 10 microns.

BRIEF DESCRIPTION OF THE DRAWING

The invention will be more readily understood by reference to the following detailed description taken in conjunction with the accompanying drawing wherein:

FIG. 1(a) is a front elevational view, in cross-section, of an electroabsorption modulator/DFB laser integrated device in accordance with the present invention;

FIG. 1(b) is a front elevation view, in cross section, of an electroabsorption modulator/optical amplifier integrated device in accordance with the present invention;

FIG. 1(c) is a front elevation view, in cross section taken across circle 1c in FIG. 1(a).

DETAILED DESCRIPTION OF THE INVENTION

Figure 2:
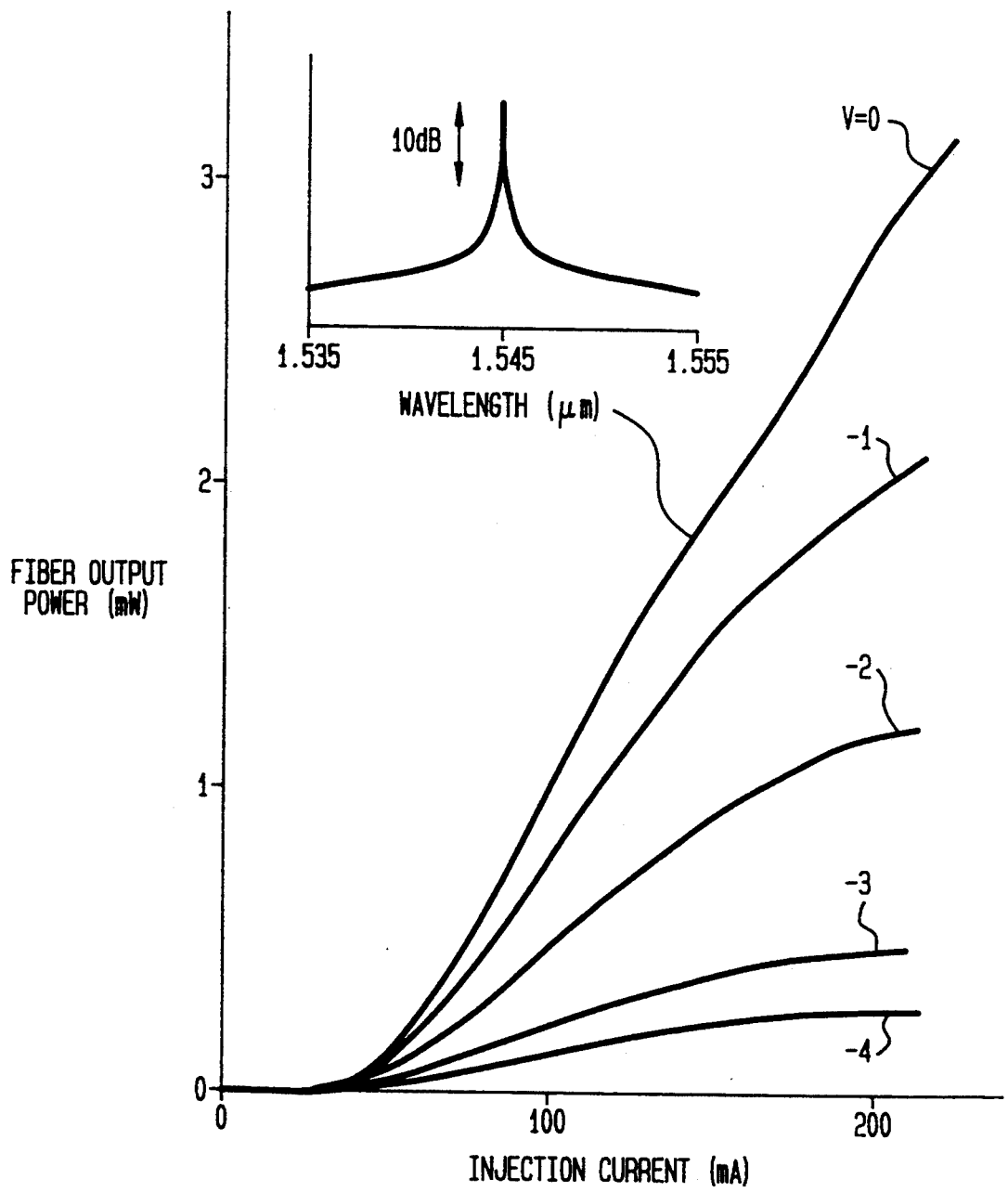
FIG. 2 is a graphical representation on coordinates of injection current in milliamperes (mA) against fiber output power in milliwatts (mW) showing the effect on light power resulting from the injection of current into the laser section of the device.

In the fabrication of an electroabsorption (EA) modulator/amplifier device in accordance with the invention, a planar polished III-V substrate is chosen, typically indium phosphide. The substrate chosen is initially masked by deposition thereon by conventional techniques of any of the commercially available photolithographic masks capable of being selectively etched in different widths and heights so as to yield a desired pattern. A particularly useful combination for attaining this end involves the use of a silicon dioxide mask and wet chemical etching with a bromine-methanol solution. However, it will be appreciated that dry etching or a combination of wet chemical etching and dry etching would also prove suitable. In order to attain the required characteristics, it has been found critical to control the height and width of the ridges generated in the etching process such that ridge width ranges from 7–13 micrometers and ridge height ranges from 1–3 micrometers. The bandgap wavelength shift caused by non-planar metal organic vapor phase epitaxy (MOVPE) typically ranges from 40 to about 70 nanometers. This shift can be reduced by reducing ridge height as well as increasing the ridge width. A preferred value has been achieved with a ridge width and height of 10 micrometers and 2 micrometers, respectively. Prior to epitaxial growth on the substrate surface, first order corrugations are formed in the ridges so generated by a holographic exposure technique across the entire surface of the substrate. Next, the grating so prepared is removed by conventional etching techniques in all areas of the substrate but for the area of the substrate designed to receive the laser.

Thereafter, strained gallium indium arsenide quantum wells with quaternary barriers are grown by metal organic vapor phase epitaxy (MOVPE). A current blocker material is deposited on the substrate selectively in those areas not destined to receive either a modulator or laser. Materials suitable for this purpose include polyimides, semi-insulating semiconductor layers, silicon dioxide, silicon nitride and the like. The device is completed by inclusion thereon of a laser structure in the ridge area and a modulator on the planar (flat) region. Studies have revealed that the bandgap is narrower on the ridge than in the planar region.

With reference now more particularly to FIG. 1(a), there is shown a front elevational view in cross-section of a device prepared in accordance with the present invention. Shown in the Fig. is a polished n-type indium phosphide substrate 11 having deposited thereon successively a layer of gallium indium arsenide phosphide 12, indium phosphide 13, strained gallium indium arsenide quantum wells with quaternary barriers together with a separate confinement heterostructure 14 and a p-type indium phosphide layer 15 (shown in the inset section to the right of the Fig. and being representative of a section of the substrate. A layer of polyimide 17 is deposited selectively on the device to block current in those areas not destined for receiving a modulator 18 and laser 19. An antireflective coating 21 is applied to the cleaved facets of the device.

FIG. 1(b) is a front elevational view, in cross-section of a device of the type shown in FIG. 1(a) with the exception that laser 19 is replaced by amplifier 21. This device is a monolithic electroabsorption modulator/amplifier in which the facets on both sides were coated with an antireflection layer. In a typical structure of this type, the peak wavelength of electroluminescence of the modulator section is of the order of −1.50 micrometers. The length of the modulator and amplifier section in a structure of this type are preferably 300 and 950 micrometers, respectively.

With reference now to FIG. 2, there is shown a graphical representation on coordinates of injection current in milliamperes against fiber output power. This Fig. shows the fiber coupled power/current characteristics of an integrated DFB laser modulator chip at varying modulator reverse voltages. The minimum threshold of the device was approximately 20 milliamperes. The lasing wavelength, as noted in the inset of the Fig. was 1.545 micrometers. It should also be noted that as the reverse voltage decreases, there is a noted enhancement in light power as a function of increasing injection current. A measure of the efficiency of the grating is also shown in the inset. More specifically, it will be noted that the device lases in a single longitudinal mode at a wavelength of 1.545 micrometers with a 30 dB peak, so revealing an acceptable side mode suppression ratio.

The wavelength dependence of the attenuation characteristic of the devices so fabricated was measured using an external tunable light source. The coupling loss was found to be −3.5 dB for each side with the likelihood for improvement existing by optimizing the waveguide structure of the integrated chip.

Figure 3:
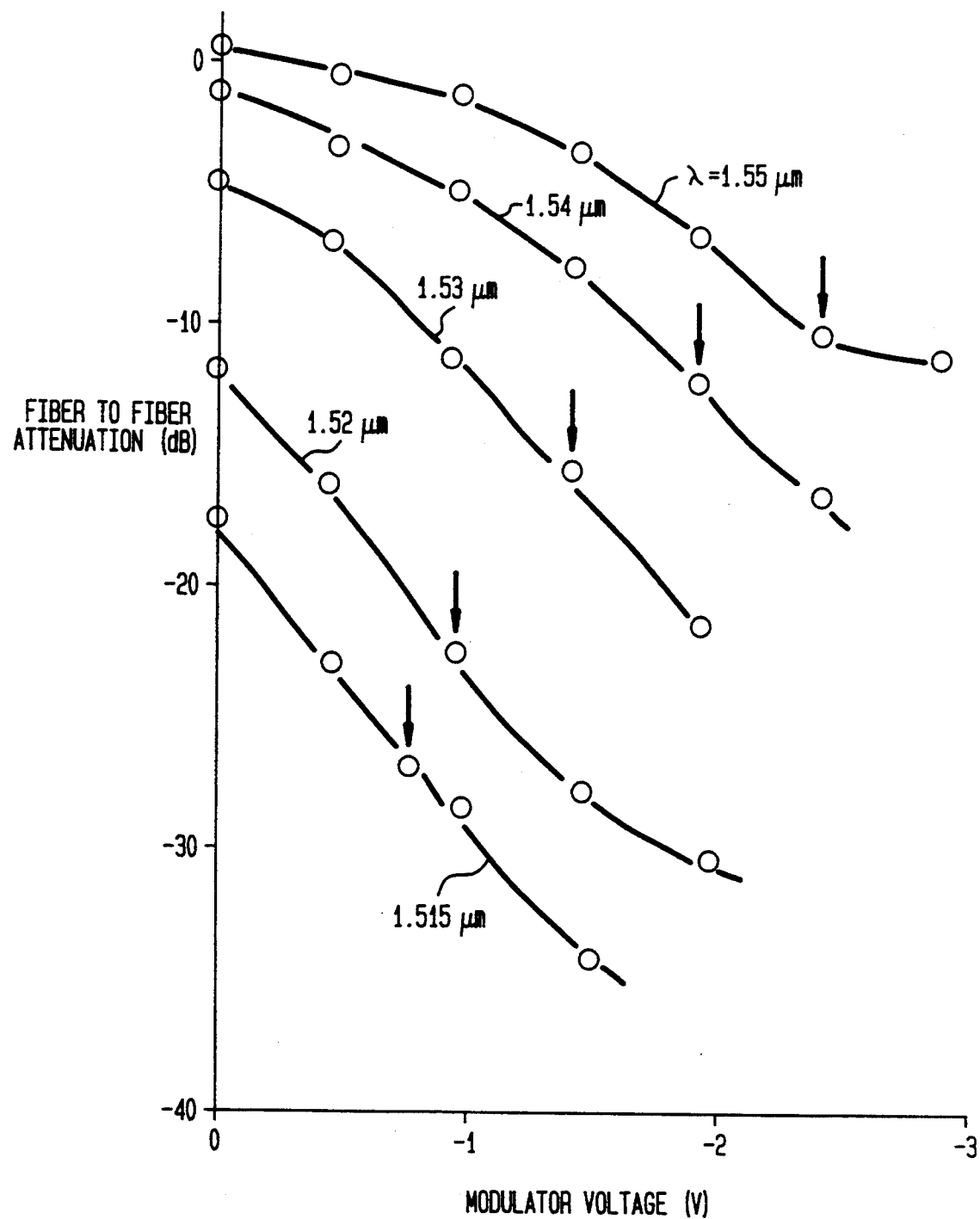
FIG. 3 is a graphical representation on coordinates of modulator voltage in volts against fiber to fiber attenuation showing variations in attenuation with reverse voltage and dependence on the wavelength of the light source. The wavelength of the integrated light source is varied by the varying the width of the ridges which are patterned on the semiconductor substrate.

FIG. 3 is a graphical representation showing the fiber to fiber attenuation characteristics for various operating wavelengths. In this measurement, an optical spectrum analyzer was used to measure the extinction ratio. The Fig. reveals that the fiber to fiber attenuation is enhanced with decreasing wavelength as the wavelength of injected light approaches the wavelength of the modulator. The insertion loss of the modulator, including fiber coupling losses, can be compensated by integration of the amplifier. Further, a reduction in the insertion loss at a shorter wavelength can be achieved by reducing the bandgap difference of the modulator and amplifier sections. As noted, the chirp parameter, alpha, of the modulator can be reduced by selection of an operating wavelength close to the bandgap wavelength of the modulator. Accordingly, the integration of the optical amplifier permits the use of an operating wavelength close to the bandgap wavelength of the modulator, so resulting in low modulation voltage and low chirp operation.

While the invention has been described in detail in the foregoing description, it will be understood by those skilled in the art that variations may be made by one skilled in the art without departing from the spirit and scope of the invention. Thus, for example, the described invention in addition to being useful in a DFB/LD external modulator and a modulator/optical amplifier may find application in a DFB/modulator/amplifier or a detector/modulator/amplifier. In this last mentioned device, the amplified signal is applied to the modulator and if the modulation characteristic is non-linear pulse shaping function is achieved, so suggesting the applicability of the device for avoiding signal distortion.

What is claimed is:

1. Method for the fabrication of a monolithically integrated laser/electroabsorption modular light source comprising the steps of
   (a) selectively patterning a III-V compound semiconductor substrate to define a planar region containing a planar area and a ridge region containing a ridge area,
   (b) forming corrugations on the ridge region in the form of a grating over the entire surface of the substrate,
   (c) removing the grating except from the ridge area,
   (d) depositing compressively strained quantum wells with quaternary barriers upon the substrate by metal organic vapor phase epitaxy,
   (e) depositing a light source on the ridge area,
   (f) depositing a modulator on the planar area, and
   (g) selectively depositing a layer of a current blocker upon all areas of said substrate but for the ridge area and the planar area.

2. Method in accordance with claim 1 wherein patterning of said substrate is effected with a silicon mask and wet chemical etching.

3. Method in accordance with claim 1 wherein the ridge region comprises a plurality of ridges having a width ranging from 7-13 micrometers and a height ranging from 1-3 micrometers.

4. Method in accordance with claim 1 wherein said quantum wells comprise gallium indium arsenide.

5. Method in accordance with claim 1 wherein the current blocker is a polyimide.

6. Method in accordance with claim 1 wherein the current blocker is a semi-insulating semiconductor layer.

7. Method in accordance with claim 1 wherein the current blocker is a silicon dioxide or silicon nitride layer.

8. Method in accordance with claim 1 wherein the light source is a laser.

9. Method in accordance with claim 1 wherein the light source is an amplifier.

10. Method in accordance with claim 1 wherein the grating region is formed by holographic exposure.

11. Method in accordance with claim 3 wherein the ridge width is 10 micrometers and the ridge height is 2 micrometers.

* * * * *